United States Patent
Grosse et al.

(10) Patent No.: US 10,927,004 B2
(45) Date of Patent: Feb. 23, 2021

(54) METHOD FOR BONDING WAFERS EUTECTICALLY, AND A WAFER COMPOSITE

(71) Applicant: Robert Bosch GmbH, Stuttgart (DE)

(72) Inventors: Axel Grosse, Pfullingen (DE); Volker Schmitz, Pfullingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/307,179

(22) PCT Filed: May 31, 2017

(86) PCT No.: PCT/EP2017/063220
§ 371 (c)(1),
(2) Date: Dec. 5, 2018

(87) PCT Pub. No.: WO2017/211654
PCT Pub. Date: Dec. 14, 2017

(65) Prior Publication Data
US 2019/0135617 A1     May 9, 2019

(30) Foreign Application Priority Data
Jun. 7, 2016     (DE) .................. 10 2016 210 007.6

(51) Int. Cl.
*H01L 21/00* (2006.01)
*B81C 1/00* (2006.01)
*B81C 3/00* (2006.01)

(52) U.S. Cl.
CPC .......... *B81C 1/00269* (2013.01); *B81C 3/001* (2013.01); *B81C 2201/019* (2013.01);
(Continued)

(58) Field of Classification Search
CPC .... B81B 7/00; B81B 7/02; B81C 1/00; B81C 3/00; B81C 99/00; H01L 29/84;
(Continued)

(56) References Cited

U.S. PATENT DOCUMENTS

2006/0208326 A1* 9/2006 Nasiri ................ B81C 1/00238
257/414

FOREIGN PATENT DOCUMENTS

DE    102009026628 A1    12/2010
DE    102014210852 A1    12/2015

OTHER PUBLICATIONS

International Search Report for PCT/EP2017/063220, dated Oct. 26, 2017.

* cited by examiner

*Primary Examiner* — Robert G Bachner
(74) *Attorney, Agent, or Firm* — Norton Rose Fulbright US LLP; Gerard Messina

(57) ABSTRACT

A method for bonding wafers eutectically, including the steps: (a) providing a first wafer having a first bonding layer and a second wafer having a second bonding layer and a spacer; (b) bringing the first wafer in juxtaposition with the second wafer, the spacer resting against the first bonding layer; (c) pressing the first wafer and the second wafer together, until the first bonding layer and the second bonding layer abut, the spacer penetrating the first bonding layer; (d) bonding the first wafer to the second wafer eutectically, by forming a eutectic alloy of at least parts of the first bonding layer and the second bonding layer. Also described is a eutectically bonded wafer composite and a micromechanical device having such a eutectically bonded wafer composite.

7 Claims, 5 Drawing Sheets

Stand der Technik (52) U.S. Cl.
CPC . *B81C 2203/0118* (2013.01); *B81C 2203/035* (2013.01); *B81C 2203/054* (2013.01)

(58) Field of Classification Search
CPC ......... H01L 21/02; H01L 21/50; H01L 23/28; H01L 23/48; H01L 27/14; H01L 27/20; C09D 11/00; G01P 15/125; G01P 15/00; G01P 15/08; G01P 3/00; A47J 36/00; A47J 36/16; A47J 43/04; A47J 43/07; B05D 3/00; F16J 15/02

See application file for complete search history.

Stand der Technik

METHOD FOR BONDING WAFERS EUTECTICALLY, AND A WAFER COMPOSITE

FIELD OF THE INVENTION

The present invention relates to a method for bonding wafers eutectically.

BACKGROUND INFORMATION

In the case of MEMS inertial sensors, the structure is often made up of a composite of two wafers. In the usual approach, a sensor wafer and a cap wafer are used for this purpose. The sensor wafer includes the sensitive, movable structure, and the cap wafer is used for its protection. The joining is carried out, using wafer bonding, e.g., in the form of seal glass bonding or eutectic bonding (e.g., silicon/gold or aluminum/germanium). This produces a hermetic bond, which allows a specific inner atmosphere to be set in a cavity, which is enclosed by the sensor wafer and cap wafer and contains the sensor core.

The bonding process takes place in a device specially designed for it. Beforehand, the two wafers are aligned with each other in a separate adjusting unit. The two wafers are fixed in position in a so-called bonding tool, which is then inserted into the bonder, as well, and is only detached again from the wafer composite after the end of the process. It is customary for the wafer surfaces to already be in contact with each other in the tool.

In the process of eutectic bonding itself, there are essentially the following manipulated variables:

Temperature

After the aligned wafers are loaded into the bonder, a specific temperature ramp is run through. Normally, the two wafers are first brought to a uniform temperature below the eutectic point (preliminary phase). Then, the temperature is increased; the eutectic point is run through (main phase). In the last step, the wafer composite is cooled.

Gas Pressure

Before the desired inner atmosphere (e.g., a vacuum for yaw rate sensors) is set, purging cycles are carried out. Consequently, contaminants, e.g., of the bonding chamber, or other residues of unwanted substances, are rinsed out and pumped off.

Clamping Force

Apart from the temperature, the clamping force is used as the actual joining mechanism of the bonding. Clamping forces during the bonding may reach up to 100 kN. The force is first applied, when the appropriate starting temperature is reached and the desired inner atmosphere is secured.

In this manner, effective bonding results may be obtained. Criteria for an effective bond include, at a minimum, outgassing and/or exhausting, reproducible bonds, (e.g., with regard to microstructure and rigidity) and imperviousness (particularly relevant for yaw-rate and acceleration sensors). Care must be taken that in the preliminary phase, the temperatures be reliably below the eutectic point.

In one refinement of the eutectic bonding in the related art, spacer tools, referred to as flags, are also used, which are situated between the two wafers and are extracted in the bonding process, during the preliminary phase. However, a disadvantage of them is that upon extraction of the flags, an additional offset between the wafers, that is, a subsequent maladjustment, may be generated.

In addition, the above-described bonding method in the related art has the disadvantage that there is a clear limitation of the temperature in the preliminary phase. Furthermore, the fact that from the beginning on, the two wafer surfaces and, consequently, the two bonding partners, are already in contact, has a negative effect on the exchange of gas via the wafer, and possibly on homogeneous surface changes (e.g., discharge of water or other adsorbed substances).

SUMMARY

The present invention relates to a method for bonding wafers eutectically, including the steps:

(a) providing a first wafer having a first bonding layer and a second wafer having a second bonding layer and having a spacer;

(b) bringing the first wafer in juxtaposition with the second wafer at a first temperature, the spacer abutting the first bonding layer;

(c) pressing the first wafer and the second wafer together, using a clamping force, until the first bonding layer and the second bonding layer abut, the spacer penetrating the first bonding layer;

(d) bonding the first wafer to the second wafer eutectically, by forming a eutectic of at least parts of the first bonding layer and the second bonding layer and, consequently, forming a wafer composite.

After step (b) and prior to step (c), one advantageous refinement of the method according to the present invention provides that in a step (e), the first wafer and the second wafer be tempered at a temperature close to a eutectic temperature.

In this context, it is particularly advantageous that in step (e), the first wafer and the second wafer are tempered at a fourth temperature close to the eutectic temperature, and subsequently, the first wafer and the second wafer are cooled to a fifth temperature, which is less than the fourth temperature but greater than the first temperature.

In another refinement, it is particularly advantageous that in step (e), the first wafer and the second wafer are tempered at a seventh temperature close to the eutectic temperature and kept at the seventh temperature up to step (d).

One advantageous refinement of the method according to the present invention provides that in step (a), the first wafer having the first bonding layer be provided, the first bonding layer being situated in a bonding region and in a support region; that in step (a), the second wafer having the second bonding layer be provided, the second bonding layer being situated in the bonding region and in the support region, the spacer being situated in the support region; that in step (c), the first wafer and the second wafer be pressed together until the first bonding layer and the second bonding layer abut in both the bonding region and the support region; and that in step (d), the eutectic be formed in both the bonding region and the support region, and, in particular, the spacer sink into the eutectic.

One advantageous refinement of the method according to the present invention provides that in step (a), the first wafer having the first bonding layer be provided, the first bonding layer being situated in a bonding region and in a support region; that in step (a), the second wafer having the second bonding layer be provided, the second bonding layer being situated in the bonding region, the spacer being situated in the support region; that in step (c), the first wafer and the second wafer be pressed together until the first bonding layer and the second bonding layer abut in the bonding region; and that in step (d), the eutectic be formed in the bonding region, and, in particular, the spacer be pressed into the first bonding layer.

The present invention also relates to a eutectically bonded wafer composite having a first wafer and a second wafer, which are joined to each other with the aid of a eutectic, characterized in that a spacer is situated between the first wafer and the second wafer.

One advantageous refinement of the eutectically bonded wafer composite of the present invention provides for the spacer to be situated next to the eutectic or to be directly surrounded at least partially by the eutectic.

One advantageous refinement of the eutectically bonded wafer composite of the present invention provides that a first bonding layer be situated on the first wafer, and that the spacer be pressed into the first bonding layer.

One advantageous refinement of the eutectically bonded wafer composite of the present invention provides that the spacer have a greater thickness than the first bonding layer.

The present invention also relates to a micromechanical device having a eutectically bonded wafer composite, as described above.

Advantages of the bonding of the present invention, using internal spacers, in comparison with eutectic bonding, using spacer tools ("flags"), which are extracted later:

The risk of subsequent maladjustment of the first wafer and the second wafer to each other upon extraction of the spacer tools is advantageously eliminated. It is also advantageous that the internal spacers are more tolerant of wafer-bow differences of the first wafer and the second wafer than the spacer tools in the related art.

Advantages of the bonding of the present invention with internal spacers, using tempering, in comparison with eutectic bonding of the related art, without spacers:

With the aid of the present invention, the temperature limitation in the related art, i.e., that the temperature in the preliminary phase must remain relatively far below the eutectic point, is removed, and in addition, the accessibility to the wafer surfaces is increased. In this manner, the surfaces may be cleaned more effectively prior to the bonding. Consequently, subsequent outgassing and discharge of exhaust gases in the finished device are reduced, i.e., for example, higher quality of a yaw rate sensor is achievable, or the setting of a precisely defined inner atmosphere is possible, which produces, in turn, lower deviations of quality. In general, instances of contamination are reduced, and unwanted effects, which may result from possible instances of contamination, are prevented or reduced considerably.

It is advantageous to use a spacer, which is made, in particular, of a patterned oxide layer and forms the surface of contact with the aluminum of the first bonding layer of the sensor wafer. The germanium of the second bonding layer, situated on the cap, is deposited as a thinner layer, so that a gap is formed between the two bonding materials, aluminum and germanium. The spacer acts similarly to a flag, which does not have to be extracted. In the subsequent bonding process, the spacer is pressed into the aluminum and displaces it in response to the application of the clamping force, so that upon contact of the aluminum and germanium at an appropriate temperature, the eutectic is produced as before. As long as the bonding materials are kept at a distance, even temperatures above the eutectic point are possible in the aligned state.

DETAILED DESCRIPTION

FIGS. 1A-E and 2A and B show a method for bonding wafers eutectically, as well as a wafer composite, in the related art.

Figure 1A:
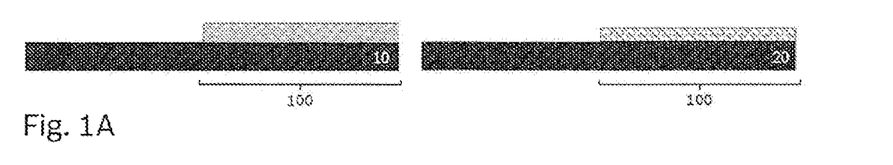
FIGS. 1A-E show a method for bonding wafers eutectically, as well as a wafer composite of the related art.

FIG. 1A schematically shows the provision of a first wafer 10 and a second wafer 20. In this context, first wafer 10 includes a first bonding layer 310 of a first material 311, in a bonding region 100. Second wafer 20 includes a second bonding layer 320 of a second material 322, in a bonding region 100. In this context, first material 311 and second material 322 are selected in such a manner, that they may form a eutectic alloy together. In this case, first material 311 may be aluminum, for example. Second material 322 is then germanium, for example.

Figure 1B:
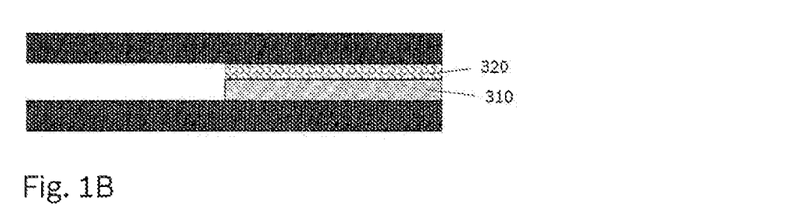

FIG. 1B schematically shows, in a first step, the positioning of first wafer 10 and second wafer 20 with respect to each other. First wafer 10 and second wafer 20 are aligned with each other in a separate adjusting unit and are inserted in a bonder in a fixed state, for example, clamped in a bonding tool. It is customary for the wafer surfaces to already be in contact with each other in the bonding tool.

Figure 1C:
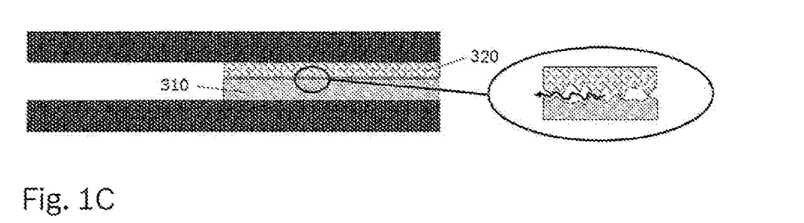

In a second step, FIG. 1C schematically shows the preliminary phase of the bonding. After the aligned wafers are loaded into the bonder, a specific temperature ramp is run through. Normally, the two wafers are first brought to a uniform temperature below the eutectic point (preliminary phase). Subsequently, the preliminary plateau is run through, exchange of gas by the wafers being possible via spaces that are a function of roughness. In this case, no tempering takes place above the eutectic point.

Figure 1D:
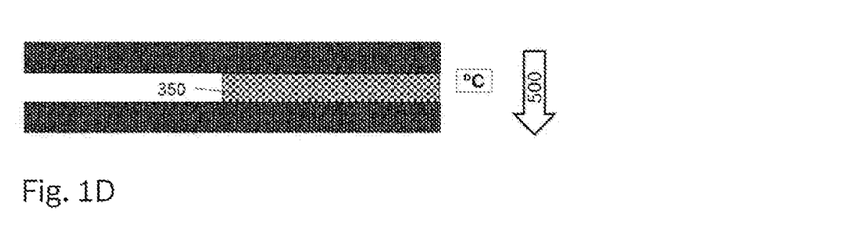

FIG. 1D schematically shows, in a third step, the main phase of the bonding, the actual eutectic bonding process. In this instance, the clamping force is applied, and the temperature is raised over the eutectic point.

Figure 1E:
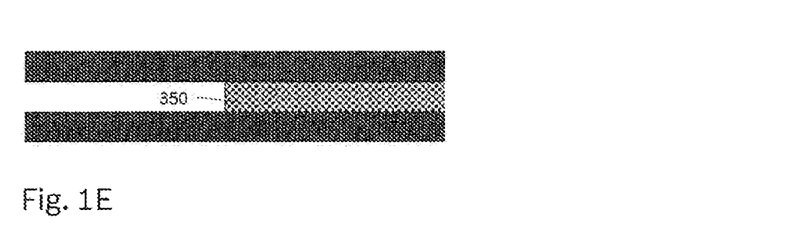

In a fourth step, FIG. 1E schematically shows the end phase of the bonding. At this juncture, the bonded wafers are cooled and subsequently removed.

FIGS. 2A-F show a first exemplary embodiment of the method of the present invention for bonding wafers eutectically.

Figure 2A:
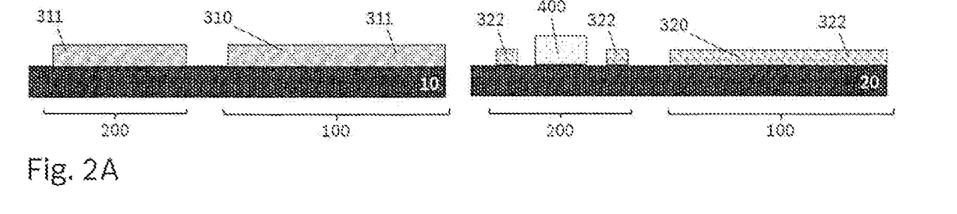
FIGS. 2A-F show a first exemplary embodiment of the method of the present invention for bonding wafers eutectically.

FIG. 2A schematically shows, in the first exemplary embodiment of the method according to the present invention, the provision of a first wafer 10 and a second wafer 20. In this context, first wafer 10 includes a first bonding layer 310 of a first bonding material 311, in a bonding region 100. Second wafer 20 includes a second bonding layer 320 of a second bonding material 322, in a bonding region 100. In this case, first bonding material 311 is, for example, aluminum. Second bonding material 322 is then germanium, for example. In contrast with the related art described above, first wafer 10 and second wafer 20 each include a support region 200. First wafer 10 also includes first bonding layer 310 of aluminum in support region 200. In support region 200, second wafer 20 includes the second bonding layer 320 of germanium, as well as a spacer 400. In this context, spacer 400 is implemented as a layer, for example, of an oxide, deposited or produced on second wafer 20. In the present example, spacer 400 is produced from thermal oxide, on second wafer 20, in this case, a silicon wafer. In this case, spacer 400 has a greater layer thickness than second bonding layer 320. First wafer 10, in this case, a silicon wafer as well, includes, for example, a micromechanical sensor after release of the MEMS structure. Second wafer 20 is, for example, a cap for the micromechanical sensor.

Figure 2B:
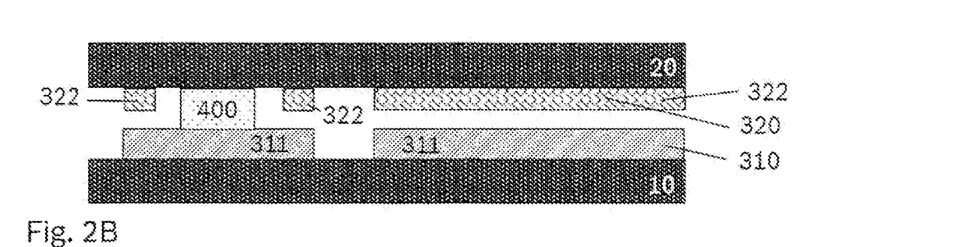

FIG. 2B schematically shows, in a first step of the method of the present invention, the positioning of first wafer 10 and second wafer 20 with respect to each other. First wafer 10 and second wafer 20 are aligned with each other in a separate adjusting unit and are inserted in a bonder in a fixed state, for example, clamped in a bonding tool. In this context, in support region 200, second wafer 20 rests on first bonding layer 310 of first wafer 10, using spacer 400.

Figure 2C:
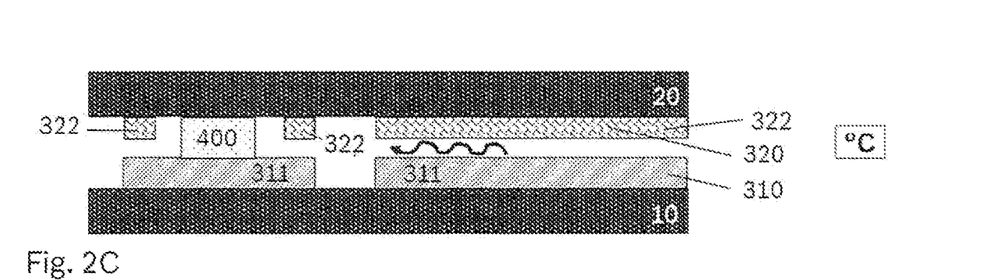

In a second step of the method of the present invention, FIG. 2C schematically shows the preliminary phase of the bonding. In the bonder, the wafers 10 and 20 aligned with each other are tempered in the preliminary phase without application of a clamping force. The gap between the wafer surfaces provided by spacer 400 improves gas exchange, desorption effects or adsorption effects. Tempering temperatures near or above the eutectic point are possible.

Figure 2D:
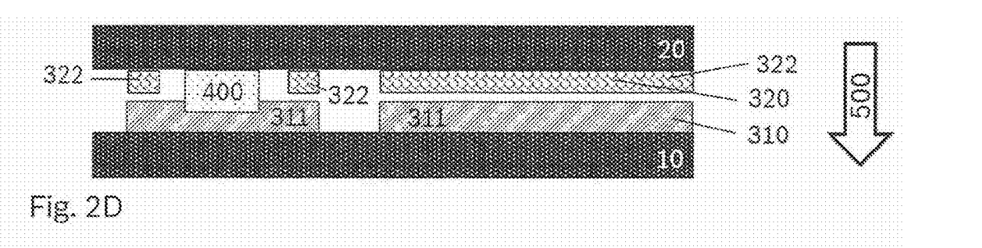

In a third step in the first exemplary embodiment of the method according to the present invention, FIG. 2D schematically shows the application of the clamping force. The actual bonding process now takes place after the tempering. In this context, two process variants a and b of the present invention are possible.

Variant a:

Clamping force 500 is first increased at a temperature T5, without exceeding the eutectic point. In so doing, spacer 400 is squeezed into the aluminum of first bonding layer 310. At the temperatures (>>300° C.), aluminum is highly ductile. Other suitable, ductile materials for the eutectic bonding include, for example, gold and tin. Spacer 400 should always be situated opposite to the softer bonding material. Spacer 400 may be situated on first wafer 10 or second wafer 20. Accordingly, the position of the softer bonding material must be changed.

Variant b:

Clamping force 500 is applied at a temperature T7 in the temperature range close to or over the eutectic point. Consequently, the formation of the molten mass and a direct transition to the following, fourth step occur immediately upon contact of the aluminum and germanium.

Figure 2E:
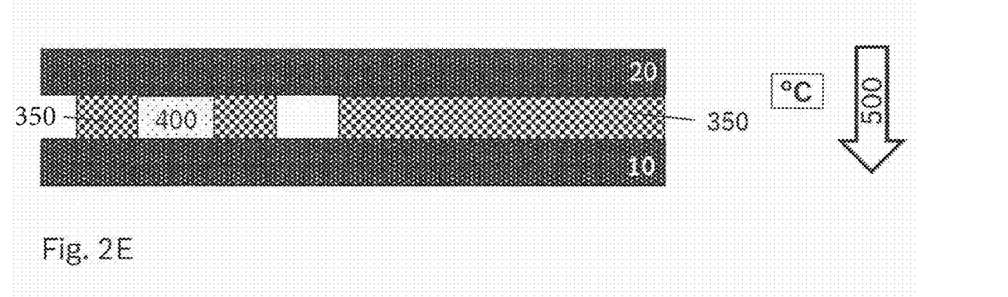

In a fourth step in the first exemplary embodiment of the method according to the present invention, FIG. 2E schematically shows the increase in temperature over the eutectic point and, consequently, the main phase of the bonding.

During the application of clamping force 500, which presses first wafer 10 and second wafer 20 together, tempering over the eutectic point is carried out. As soon as the aluminum and germanium come into contact, a molten mass is formed, the eutectic 350. The formation of a bond takes place in a manner known in the related art. In the first exemplary embodiment of the present invention described here, spacer 400 is accordingly surrounded by material of eutectic alloy 350 in the process. Any occurring stress decreases.

Figure 2F:
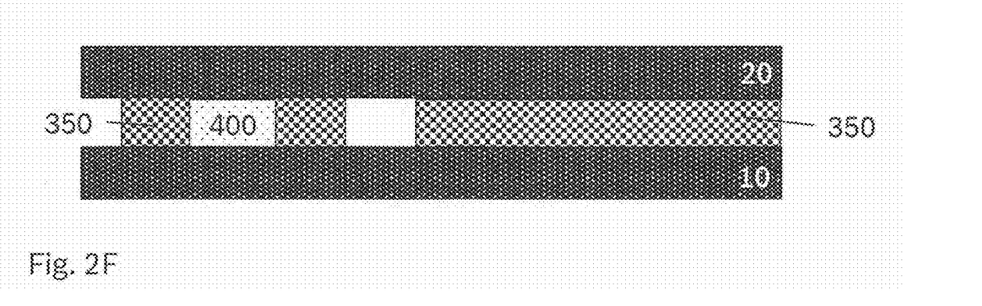

FIG. 2F schematically shows, in a fifth step of the method according to the present invention, the end phase of the bonding. In the fifth and last step, the wafer composite is cooled off. The wafer stack is subsequently removed and processed further.

Figure 3A:
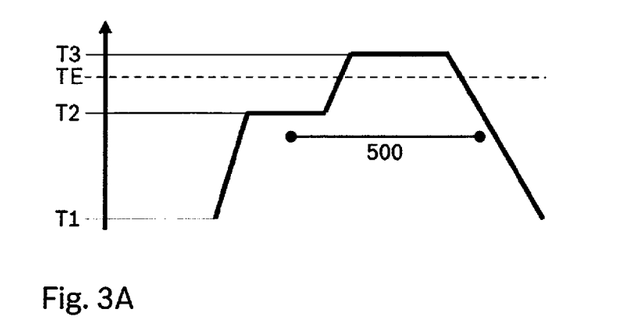
FIGS. 3A-C show, in comparison, temperature profiles during the eutectic bonding in the related art and in the method of the present invention.
Figure 3B:
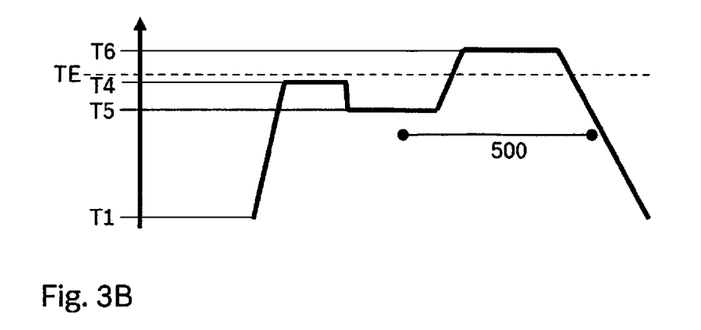
Figure 3C:
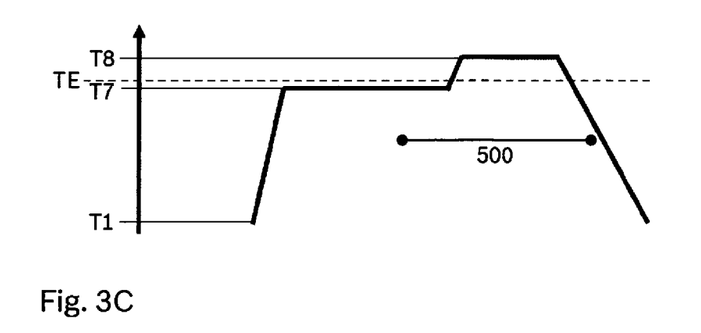

FIGS. 3A-C show, in comparison, temperature profiles in the case of the eutectic bonding in the related art and in the method of the present invention. The curve of the process temperature over time is represented schematically.

FIG. 3a shows a typical temperature profile for eutectic bonding in the related art. In this context, the two wafers in the aligned state are initially heated from a first temperature T1 to a second temperature T2. At this second temperature T2, the two wafers run through a plateau phase. The preliminary phase at temperature T2 is used for setting uniform tempering of the aligned wafers. In this phase, the inner atmosphere is also set. At an applied clamping force 500, the two wafers are subsequently heated above eutectic temperature TE to a third temperature T3. In the process, the eutectic alloy is formed, and, consequently, the eutectic bond is formed. Subsequently, the eutectically bonded wafer composite is cooled.

FIG. 3B shows the temperature profile of the method of the present invention for eutectic bonding, in variant a, including tempering. In this instance, the two wafers in the aligned state are initially heated from a first temperature T1 to a fourth temperature T4 near TE, that is, up to a few degrees Kelvin below or above eutectic temperature TE. The two wafers are then cooled to a fifth temperature T5, which is less than fourth temperature T4 but greater than temperature T1. Thus, tempering at the fourth temperature T4 close to or above eutectic temperature TE is carried out prior to the preliminary phase. Temperature T5 is used as an initial value for the actual bonding process. Bonding still does not take place upon the application of clamping force 500. The two wafers are subsequently heated under contact pressure, to a sixth temperature T6, which lies above eutectic temperature TE. In so doing, the eutectic bond is produced. Subsequently, the eutectically bonded wafer composite is cooled.

FIG. 3C shows the temperature profile of the method of the present invention for eutectic bonding, in variant b, including tempering. In this instance, the two wafers in the aligned state are initially heated from a first temperature T1 to a seventh temperature T7 near TE, that is, up to a few degrees Kelvin below or above eutectic temperature TE. The preliminary phase takes place at the seventh temperature T7 close to or above eutectic temperature TE. The actual bonding process follows seamlessly. If T7>TE, then, immediately upon application of clamping force 500, the eutectic is formed and, therefore, the start of the bonding takes place. If T7<TE, the eutectic is only formed upon further heating of the two wafers and the transition to an eighth temperature T8.

The two variants a and b of the method of the present invention shown in FIGS. 3B and 3C have a shorter bonding time, that is, a shorter process duration, than the eutectic bonding in the related art, as shown in FIG. 3A.

Figure 4A:
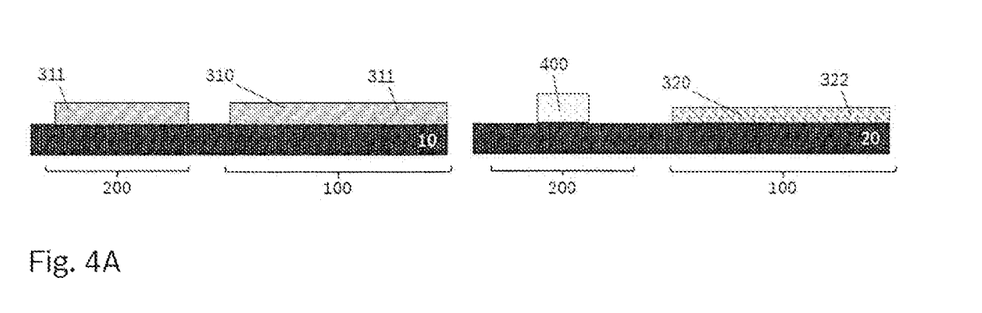
FIGS. 4A-C show a second exemplary embodiment of the method of the present invention for bonding wafers eutectically.
Figure 4B:
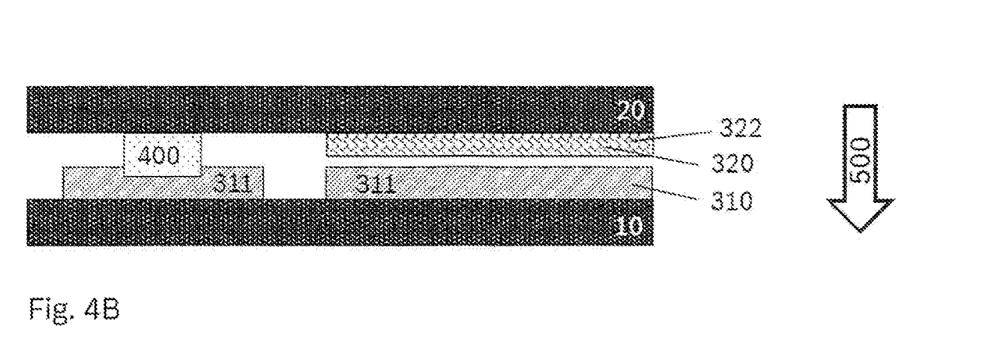
Figure 4C:
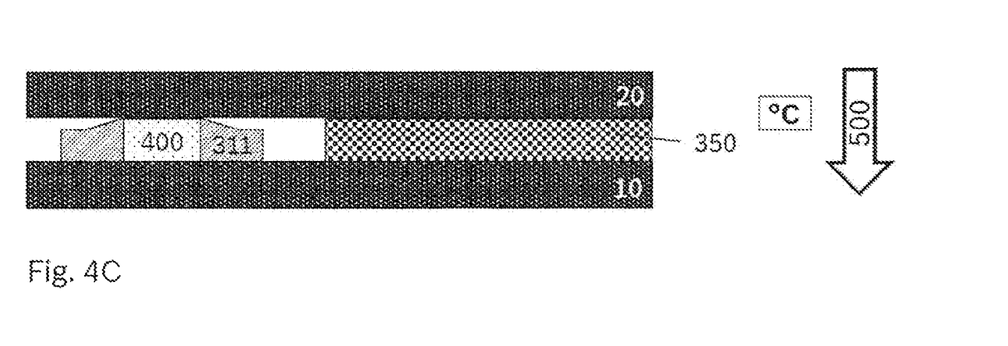

FIGS. 4A-C show a second exemplary embodiment of the method of the present invention for bonding wafers eutectically. The main differences from the first exemplary embodiment are described below.

FIG. 4A schematically shows the provision of a first wafer 10 and a second wafer 20. In this context, first wafer 10 includes a first bonding layer 310 of a first bonding material 311, in a bonding region 100. Second wafer 20 includes a second bonding layer 320 of a second bonding material 322, in a bonding region 100. In this case, once again, first bonding material 311 is, for example, aluminum. Second bonding material 322 is then germanium, for example. In contrast with the first exemplary embodiment described above, first wafer 10 and second wafer 20 each include a support region 200. First wafer 10 also includes first bonding layer 310 of aluminum in support region 200. In contrast with the first exemplary embodiment described above, second wafer 20 includes only one spacer 400 in support region 200. In this context, spacer 400 is implemented as a layer, for example, of an oxide, deposited or produced on second wafer 20. In this case, spacer 400 has a greater layer thickness than second bonding layer 320.

The first method step and the second method step proceed analogously to the first exemplary embodiment shown in FIGS. 2B and 2C.

FIG. 4B schematically shows, in the third step, the application of the clamping force. Clamping force 500 acts along the arrow.

The actual bonding process takes place after the tempering. In this instance, two process variants a and b are, once again, possible.

Variant a:

First, clamping force 500 is increased at fifth temperature T5, without exceeding the eutectic point. This causes spacer 400 to be pressed into the aluminum of first bonding layer 310. The aluminum is pushed aside in the process. At the temperatures (>>300° C.), aluminum is highly ductile. Finally, first bonding layer 310 and second bonding layer 320 come into contact together. The temperature profile corresponds to the one shown in FIG. 3B.

Variant b:

Clamping force 500 is applied at temperature T7 in the temperature range close to or above the eutectic point. Consequently, the molten mass is formed immediately upon contact of the aluminum and germanium (see fourth step), but not in the region of spacer 400. The temperature profile corresponds to the one shown in FIG. 3C.

In the fourth step, FIG. 4C schematically shows the increase in temperature over the eutectic point and, consequently, the main phase of the bonding. During application of clamping force 500, tempering is carried out over the eutectic point. As soon as the aluminum and germanium come into contact, the molten mass is formed, the eutectic 350. The bond is formed as usual, but not in the region of spacer 400. There, the aluminum of first bonding layer 310 is displaced. Spacer 400 is surrounded by aluminum.

In the fifth and last step, the wafer composite is subsequently cooled off.

The following layer thicknesses were experimentally tested and verified: first bonding layer 310 of first bonding material 311, aluminum: 1.35 second bonding layer 320 of second bonding material 322, germanium: 0.75 spacer 400: 1.6 Therefore, the gap between the bonding materials is approximately 1 μm. In principle, it may also be designed to be larger, but the corresponding bond partners must be suitably adapted. Two specific embodiments may be distinguished (both verified in the experiment):

Pure Compression

In this case, spacer 400 is pressed into the aluminum of first bonding layer 310. The high clamping force 500 ensures that the displacement of the aluminum is so large, that effective bonding is achieved.

"Sinking" in the Eutectic

In this case, aluminum is displaced by compression, until first and second bond materials 311, 312 are in contact with each other. As soon as this point is reached, a eutectic is formed around spacer 400 at a suitable temperature; the eutectic surrounding spacer 400 and relaxing occurring stress. In this case, the germanium layer extends close to spacer 400, but must keep a minimum distance. The geometry of spacer 400 is flexible. It is clear that the spacer surface area is proportional to the displacement, and that this must be taken into consideration. A regular distribution of spacers 400 on the wafer is to be sought, in order to prevent wafer-bow effects. Placement in the scribe line, that is, in regions, in which the wafer composite is later separated into individual devices, appears suitable for reasons of space.

Consequently, there is the option of carrying out more complex bonding processes. Thus, the preliminary phase may be run through at temperatures close to or above the eutectic point. In addition, purging with surface-reactive gases or chemicals (e.g., for desorption, adsorption or substitution of components) may be accomplished more effectively, owing to the spacer.

In principle, the present invention is also conceivable for other wafer pairings, e.g., of a sensor wafer and ASIC wafer (ASIC as a cap).

LIST OF REFERENCE SYMBOLS 10 first wafer
20 second wafer
100 bonding region
200 support region (adjustment region)
310 first bonding layer (Al)
311 first bonding material (Al)
320 second bonding layer (Ge)
322 second bonding material (Ge)
350 eutectic of first and second bonding material (AlGe)
400 spacer
500 clamping force
T1 first temperature
T2 second temperature
T3 third temperature
T4 fourth temperature
T5 fifth temperature
T6 sixth temperature
T7 seventh temperature
T8 eighth temperature
TE eutectic temperature

What is claimed is:

1. A method for bonding wafers eutectically, comprising:
   (a) providing a first wafer having a first bonding layer and a second wafer having a second bonding layer and having a spacer;
   (b) bringing the first wafer in juxtaposition with the second wafer at a first temperature, the spacer resting against the first bonding layer;
   (c) pressing the first wafer and the second wafer together, using a clamping force, until the first bonding layer and the second bonding layer abut, the spacer (400) penetrating the first bonding layer;
   (d) bonding the first wafer to the second wafer eutectically, by forming a eutectic of at least parts of the first bonding layer and the second bonding layer and, consequently, forming a wafer composite; and
   (e) after step (b) and prior to step (c), tempering the first wafer and the second wafer at a temperature to a few degrees Kelvin below or above a eutectic temperature.

2. The method for bonding wafers eutectically, as recited in claim 1, wherein in the step (e), the first wafer and the second wafer are tempered at a fourth temperature to a few degrees Kelvin below or above the eutectic temperature, the method further comprising:
   subsequently cooling the first wafer and the second wafer to a fifth temperature that is less than the fourth temperature and greater than the first temperature.

3. The method for bonding wafers eutectically, as recited in claim 1, wherein in the step (e), the first wafer and the second wafer are tempered at a seventh temperature to a few degrees Kelvin below or above the eutectic temperature and held at the seventh temperature up to the step (d).

4. A method for bonding wafers eutectically, comprising:
(a) providing a first wafer having a first bonding layer and a second wafer having a second bonding layer and having a spacer;
(b) bringing the first wafer in juxtaposition with the second wafer at a first temperature, the spacer resting against the first bonding layer;
(c) pressing the first wafer and the second wafer together, using a clamping force, until the first bonding layer and the second bonding layer abut, the spacer (400) penetrating the first bonding layer; and
(d) bonding the first wafer to the second wafer eutectically, by forming a eutectic of at least parts of the first bonding layer and the second bonding layer and, consequently, forming a wafer composite,
wherein:
in the step (a), the first wafer having the first bonding layer is provided, the first bonding layer being located in a bonding region and in a support region,
in the step (a), the second wafer having the second bonding layer is provided, the second bonding layer being situated in the bonding region and in the support region, the spacer being situated in the support region,
in the step (c), the first wafer and the second wafer are pressed together, until the first bonding layer and the second bonding layer abut in both the bonding region and the support region, and
in the step (d), the eutectic is formed in both the bonding region and the support region.

5. The method for bonding wafers eutectically, as recited in claim 4, wherein, in the step (d), the spacer sinks into the eutectic.

6. A method for bonding wafers eutectically, comprising:
(a) providing a first wafer having a first bonding layer and a second wafer having a second bonding layer and having a spacer;
(b) bringing the first wafer in juxtaposition with the second wafer at a first temperature, the spacer resting against the first bonding layer;
(c) pressing the first wafer and the second wafer together, using a clamping force, until the first bonding layer and the second bonding layer abut, the spacer (400) penetrating the first bonding layer; and
(d) bonding the first wafer to the second wafer eutectically, by forming a eutectic of at least parts of the first bonding layer and the second bonding layer and, consequently, forming a wafer composite,
wherein:
in the step (a), the first wafer having the first bonding layer is provided, the first bonding layer being located in a bonding region and in a support region,
in the step (a), the second wafer having the second bonding layer is provided, the second bonding layer being situated in the bonding region, the spacer being situated in the support region, in the step (c), the first wafer and the second wafer are pressed together until the first bonding layer and the second bonding layer abut in the bonding region, and
in the step (d), the eutectic is formed in the bonding region.

7. The method for bonding wafers eutectically, as recited in claim 6, wherein, in the step (d), the spacer is pressed into the first bonding layer.

* * * * *